(12) United States Patent
Codding et al.

(10) Patent No.: US 7,348,216 B2
(45) Date of Patent: Mar. 25, 2008

(54) REWORK PROCESS FOR REMOVING RESIDUAL UV ADHESIVE FROM C4 WAFER SURFACES

(75) Inventors: Steven R. Codding, Underhill Center, VT (US); Timothy C. Krywanczyk, Essex Junction, VT (US); Edmund J. Sprogis, Underhill, VT (US); Jocelyn Sylvestre, Granby (CA); Matthew R. Whalen, Chelsea, VT (US)

(73) Assignee: International Business Machines Corporation, Armonk, NY (US)

( * ) Notice: Subject to any disclaimer, the term of this patent is extended or adjusted under 35 U.S.C. 154(b) by 184 days.

(21) Appl. No.: 11/243,882

(22) Filed: Oct. 4, 2005

(65) Prior Publication Data

US 2007/0077752 A1    Apr. 5, 2007

(51) Int. Cl.
*H01L 21/00* (2006.01)
(52) U.S. Cl. ............... 438/108; 438/118; 257/E21.237
(58) Field of Classification Search .............. 438/108, 438/118
See application file for complete search history.

(56) References Cited

U.S. PATENT DOCUMENTS

| | | | |
|---|---|---|---|
| 4,714,511 A * | 12/1987 | Nakao | ............... 156/285 |
| 4,925,515 A | 5/1990 | Yoshimura et al. | |
| 5,106,439 A | 4/1992 | Wellings et al. | |
| 5,246,533 A | 9/1993 | Mochizuki | |
| 5,310,442 A | 5/1994 | Ametani | |
| 5,981,391 A * | 11/1999 | Yamada | ............... 438/690 |
| 6,007,654 A | 12/1999 | McKenna | |
| 6,256,152 B1 * | 7/2001 | Coldrey et al. | ............ 359/642 |
| 6,716,295 B2 | 4/2004 | Yamamoto | |
| 6,872,268 B2 | 3/2005 | David et al. | |
| 7,025,891 B2 * | 4/2006 | Codding et al. | ............ 216/12 |
| 7,060,526 B2 * | 6/2006 | Farnworth et al. | .......... 438/106 |
| 2002/0014465 A1 * | 2/2002 | Chung | ............... 211/126.1 |
| 2005/0045591 A1 * | 3/2005 | Codding et al. | ............... 216/83 |
| 2005/0170547 A1 * | 8/2005 | Patel et al. | ............... 438/51 |

* cited by examiner

*Primary Examiner*—Michael Lebentritt
*Assistant Examiner*—Seahvosh Nikmanesh
(74) *Attorney, Agent, or Firm*—Scully, Scott, Murphy & Presser, P.C.; William H. Steinberg

(57) ABSTRACT

A method for the removal of residual UV radiation-sensitive adhesive from the surfaces of semiconductor wafers, remaining thereon from protective UV radiation-sensitive tapes which were stripped from the semiconductor wafers. Moreover, provided is an arrangement for implementing the removal of residual sensitive adhesive, which remain from tapes employed as protective layers on semiconductor wafers, particularly wafers having surfaces including C4 connections.

10 Claims, 1 Drawing Sheet

REWORK PROCESS FOR REMOVING RESIDUAL UV ADHESIVE FROM C4 WAFER SURFACES

BACKGROUND OF THE INVENTION

1. Field of the Invention

The present invention relates to a method for the removal of residual UV radiation-sensitive adhesive from the surfaces of semiconductor wafers, remaining thereon from protective UV radiation-sensitive tapes, which were stripped from the semiconductor wafers. The invention further resides to an arrangement for implementing the removal of residual sensitive adhesive, which remain from tapes (hereinafter referred to as UV tapes) employed as protective layers on semiconductor wafers, particularly wafers having surfaces including C4 connections.

In the present state of the technology which is directed to the manufacture of semiconductor wafers, and especially but not limited to semiconductor wafers, which are employed for the incorporation of collapsed control chip connections (C4s) it is becoming necessary that in view of thermal dissipation problems and packaging requirements which necessitate the employment of thinner dies formed from such semiconductor wafers, that special measures be taken to protect the wafer surfaces and the electronic elements and C4 connections located thereon. Generally, the process of thinning the semiconductor wafers, referred to as C4 wafers, entails the application of a protective adhesive tape as is commonly employed in the industry, onto the surface of the semiconductor wafers having the electronic components and connections located thereon, so as to protect the components and the C4 connections during the semiconductor wafer thinning procedure. Ordinarily, the thinning process is carried out by means of suitable grinding and polishing the obverse or back side of the wafer creating dust and particulate debris from which the front wafer surface is to be protected by the tape. Upon completion of the thinning of the wafer, the adhesive tape is generally exposed to ultraviolet light in order to deactivate the adhesive of ultraviolet light-sensitive adhesive tape and thereby reduce the level of tackiness of the tape to the front surface of the semiconductor wafer on which it is positioned. Upon completion of the tape to UV radiation exposure, which facilitates the release of the tape from the surface of the semiconductor wafer, the tape is peeled off from the front surface of the wafer covering the electronic components and from the C4 connections. However, during the initial wafer taping, or lamination procedure in applying the UV radiation or light-sensitive tape onto the surface of the semiconductor wafer and also during the delamination thereof, i.e., the detaping or tape peeling procedure, problems may be encountered which adversely effect the UV tape deactivation, and which may cause residual adhesive material from the tape to remain on the semiconductor wafer surface.

Among such problems are the formation of gaseous or air bubbles between the surface of the semiconductor wafer and the applied protective tape, which are formed during the lamination of the latter to the surface of the wafer, the formation of UV bulb-like configurations, resulting in a non-uniform lamination being produced about the surface of the semiconductor wafer, and in an improper UV radiation exposure prior to implementing the delamination or peeling of the UV radiation-sensitive adhesive tape from the surface of the semiconductor wafer. As a result of these problems, upon occasion residual adhesive from the UV tape remains adherent to the surface of the wafer and to the C4 connections during delamination and peeling off of the UV tape. The removal of such residual adhesive is quite difficult and not always readily achievable, whereby attempts have been made to utilize a known solvent, such as an NMP, IPA, S/N or the like, which are not always efficacious and frequently fail to remove some or all the adhesive residue. The use of stronger solvents or a process of sputtering may result in damage being encountered by the materials of the electronic components, the C4 connections, aluminum pads on the wafer, and the polyimide composition of the semiconductor wafer during exposure thereto. This, at times, renders the entire semiconductor device being processed non-usable and may lead to economic losses in implementing the manufacturing process.

2. Discussion of the Prior Art

Various publications have to be directed to the application of protective tapes to semiconductor wafers or the like, however, none of which are deemed pertinent with regard to the inventive concept.

David, et al., U.S. Pat. No. 6,872,268 B2 disclose a method of conforming an adherent film and pertains to applying a tape to a substrate and also employing a vacuum to closely adhere the tape to the surface of the substrate.

Yamamoto, U.S. Pat. No. 6,716,295 B2 relates to the application of a protective tape to a substrate and thereafter separating the latter from a substrate by employing a two-tape system for application and then subsequent delamination in an attempt to avoid the formation of tape adhesive residues. However, there is no process of removing such adhesive residues in a simple and clean manner analogous to that of the present invention.

McKenna, U.S. Pat. No. 6,007,654 relates to a non-contact method of adhering a wafer to a wafer tape, and wherein this is essentially implemented in a non-contacting manner through the application of a gas jet which forces the tape against the surface of the wafer or substrate.

Ametani, U.S. Pat. No. 5,310,442 describes an apparatus for respectively applying and removing a protective adhesive tape from a substrate, such as a semiconductor wafer, and does not concern itself with the removal of any remaining adhesive residue through a method analogous with described by the invention.

Mochizuki, U.S. Pat. No. 5,246,533 describes an apparatus for the press-bonding of a tape onto the edges of a workpiece. There is no disclosure of any aspect for removing residual adhesive from the surface of a semiconductor mounting electronic components which were located underneath a protective tape that has been peeled off the surface.

Wellings, et al., U.S. Pat. No. 5,106,439 disclose an application of coverings to a substrate surface, wherein the coverings are applied to the substrate under pressure and/or a vacuum is a sequentially employed manner. There is no disclosure of a method for removing residual adhesive from the surface of a semiconductor wafer, which has remained thereon subsequent to the removal of a protective adhesive tape.

Finally, Nakao, U.S. Pat. No. 4,714,511 describes a method and apparatus for adhering a tape or a sheet to a semiconductor wafer, however, which does not pertain to a method of attempting the removal of residual adhesive from the tape on the surface of the semiconductor wafer.

SUMMARY OF THE INVENTION

Accordingly, in order to obviate the disadvantages and drawbacks, which are encountered in the prior art during the removal or peeling away of the previously applied adhesive tape, such as UV tape, from the surface of a semiconductor wafer wherein the tape has been employed to protectively cover the electronic elements and/or C4 connections and pads thereon from debris or contaminants, and wherein residual adhesive material from the tape remains adherent to the surface of the semiconductor wafer, and on the electronic components, it is the purpose of the present invention to cleanse the surface of the semiconductor wafer, electronic components and C4 connections are pads from the presence of the residual adhesive without any damage being encountered by the wafer surface and/or components.

In order to achieve the foregoing surface cleansing effect, pursuant to one aspect of the invention, UV tape is reapplied to the residual adhesive-containing wafer surface utilizing a vacuum system. The vacuum system is adapted to prevent any air pockets from forming around the C4s and any other electronic components intermediate the facing surfaces of the semiconductor wafer and of the UV tape. This, in effect, will permit the newly applied UV tape to completely and uniformly adhere to the residual UV adhesive remaining on the wafer surface from the precedingly removed adhesive tape or UV tape. The subsequent exposure of the wafer and reapplied tape to UV radiation now fully deactivates the UV adhesive and facilitates delamination of the reapplied UV tape so as to enable all previous residual adhesive to be removed from the wafer and components surfaces. If necessary, the foregoing may be repeated subject to inspection until any remaining residual adhesive has been fully removed.

Pursuant to an alternative aspect of the invention, a UV tape is reapplied to the residual adhesive-containing surface of the semiconductor wafer in that the tape facing the semiconductor wafer surface, or the latter has a 10% IPA (Isopropyl Alcohol) solution applied thereto. This eliminates any air pockets or the formation of bubbles from being created around the C4 connections or at any other location on the wafer surface. The solution is applied prior to the application of the tape, thereby inhibiting the entrapment of air about the C4 connections on the wafer surface.

Accordingly, it is an object of the present invention to provide a method for the removal of residual UV adhesive remaining from a previously applied protective tape on a wafer surface, which was peeled from the surface of the semiconductor wafer.

Another object of the present invention resides in the provision of a novel method for reapplying a UV tape to the surface of a semiconductor wafer having electronic elements and C4 connections thereon so as to remove residual adhesive material therefrom, through the intermediary of a vacuum arrangement and then applying a UV treatment to be able to again remove the UV tape in conjunction with any residual adhesive from the surface of the semiconductor wafer.

Yet another object of the invention resides in the provision of a method for reapplying a UV tape to the surface of a semiconductor wafer having electronic elements and C4 connections thereon so as to remove residual adhesive materials therefrom, through the application of a solution containing any IPA (Isopropyl Alcohol) or equivalent liquid prior to or during tape application so as to inhibit the entrapment of air about the C4 connections or the formation of air pockets and bubbles.

Another object resides in the provision of a vacuum arrangement for enabling the removal of residual adhesive from previously applied UV tapes from the surface of a C4 semiconductor wafer through a reapplication of UV tape.

BRIEF DESCRIPTION OF THE DRAWINGS

Reference may now be made to the following detailed description of a preferred embodiment of the invention, taken in conjunction with the accompanying drawings; in which.

DETAILED DESCRIPTION OF THE INVENTION

Figure 1:
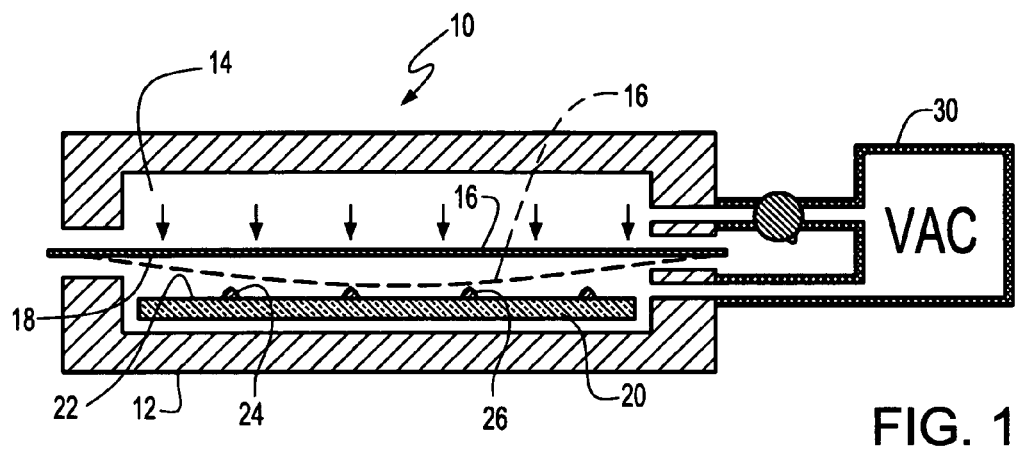
FIG. 1 illustrates, generally diagrammatically, an arrangement for applying a UV-sensitive adhesive tape to the surface of a semiconductor wafer through the utilization of a vacuum.
Figure 2:
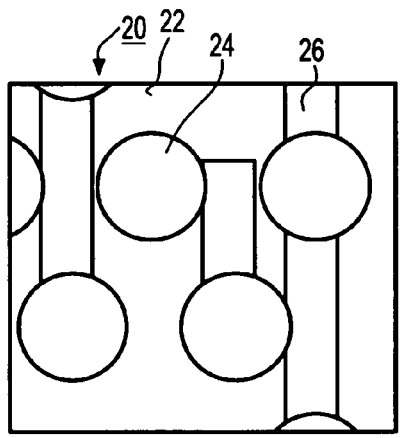
FIG. 2 illustrates the presence of residual adhesive from the UV tape on C4 connections on the surface of a semiconductor wafer.
Figure 3:
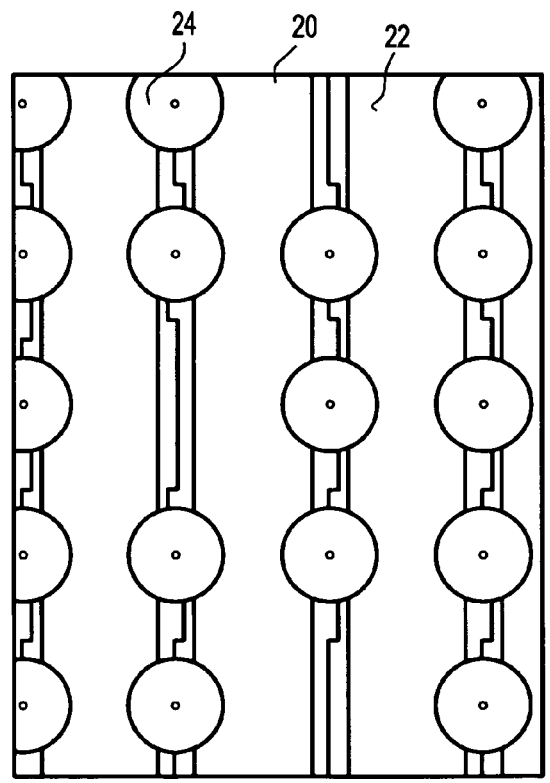
FIG. 3 illustrates the semiconductor wafer surface subsequent to the residual adhesive having been removed from the surface and the C4 connections.

Referring now in specific detail to the drawings, illustrated in FIG. 1 is a vacuum arrangement 10, including a vacuum housing 12 having a chamber 14 in which a length of UV adhesive tape 16 having an adhesive surface layer 18 may be positioned. The adhesive surface layer 18 is adapted to be subjected to UV radiation so as to enable the reduction of its adhesive properties, as described hereinbelow. A semiconductor wafer 20 is arranged within the confines of the chamber 14 in close parallel relationship with the adhesive surface of the UV tape 16. The surface 22 of the semiconductor wafer 20 facing the UV tape 16 includes C4 connections 24, such as are shown in FIGS. 2 and 3 of the drawings, and may also comprise various other electronic circuit components, such as pads and the like (not shown), as is well known in the technology. Surface portions of the surface 22 of the semiconductor wafer 20 and regions about the C4 connections 24 may contain some residual UV adhesive material from preceding protective layer of UV tape which protectively covered the wafer surface 22 during previous manufacturing process steps, such as during grinding and polishing of the reverse or back side of the semiconductor wafer 20 in order to implement the thinning thereof, as is known in the art.

After that previous process step has been completed, the protective tape was subjected to UV light and delaminated, i.e., peeled off the wafer surface, which in some instances will leaves an amount of UV adhesive material from the tape to remain adherent to the surface of the semiconductor wafer 20 and also the C4 connections or bumps and other electronic components on the wafer. Generally, as mentioned hereinabove, such adhesive residues are difficult to remove through the intermediary of treatments with solvents or other chemical and or heating methods, which may lead to the potential damaging of the components and material of the semiconductor wafer, and resultingly inoperable scrap.

In particular, referring again to FIG. 1 of the drawings, in order to be able to remove such residual adhesive 26, the semiconductor wafer 20 with the C4 connections 24 and any other components are positioned so that the surface 22 thereof faces upwardly into the arrangement from the bottom of the housing chamber 14, and face towards a further UV adhesive tape 16 having an adhesive layer facing the wafer, which is positioned in parallel, closely spaced relationship therebelow.

Thereafter, a vacuum is applied by means of vacuum pump 30 connected to the chamber so as to create a subatmospheric pressure in the chamber 14 of the housing 12 pulling the UV tape into close surface area contact with the facing surface 22 of the semiconductor wafer 20, and closely encasing the electronic structures or elements thereon, including the C4 connections, in the absence of the formation of any air gaps or bubbles. A liquid may be present on the surface of the UV tape in the nature of a 10% IPA solution to produce the inventive UV case tape 16. Gas may be introduced into the chamber to further press the tape against the wafer surface. Thereafter, the vacuum is released and the semiconductor wafer, including the closely adherent UV cure tape removed from the chamber, and UV radiation applied thereto in order to eliminate or reduce the tacking effect between the semiconductor surface and the tape, and the tape delaminated or peeled off. This will cause the previously deposited residual UV adhesive to adhere to the UV cure tape and be pulled away from the wafer surface 22 in conjunction with the tape. Thereafter, if required, the surface of the semiconductor device may optionally be subjected to a stream of a gaseous cleaning medium, such as nitrogen or the like, in order to further cleanse the surface and, the above procedure for the removal of residual UV adhesive may be repeated, when warranted by an inspection, in the case that any adhesive material residue is still present on the surface of the semiconductor wafer and components.

From the foregoing, it becomes readily apparent that it is possible to remove contaminants or the like, such as are formed by UV adhesive residues from a previously delaminated UV tape in the absence of having to employ solvents or chemicals which may be deleterious to the processing and integrity of the semiconductor wafer or to the components and C4 connections arranged thereon.

As diagrammatically illustrated in FIG. 2 of the drawings, there are shown C4 bumps 24 on the surface 22 of the semiconductor wafer 20 with the protective tape having been removed and showing residual strips of adhesive material remaining thereon. To the contrary, shown in FIG. 3, subsequent to the reapplication of a UV cure tape by means of operation of vacuum arrangement 10 and curing and tape removal, this shows the areas free and clear of any such adhesive residues, indicating that the surface of the semiconductor wafer is in a clean condition.

In an alternative method to that described above, or in addition thereto, the application of the UV 16 to the surface 22 of semiconductor wafer 20 may be preceded by the application of a liquid solvent, preferably such as a 10% solution of Isopropyl Alcohol (IPA), between the tape and the wafer surface. This creates an effect similar to that of the application of a vacuum, and eliminates air pockets or bubbles from being created about the C4 connections or bumps 24 on the surface 22 of the wafer 20. Consequently, this ensures a complete removal of residual adhesive remaining from a previously peeled off tape.

Although, 10% solution of IPA is preferred, other solvents and/or solution strengths can be contemplated, although this may possibly raise compatibility issues with the semiconductor wafer materials.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

What is claimed is:

1. A method for the removal of residual UV adhesive deposits from the surface of a semiconductor wafer, comprising the steps of:
    arranging a pressure-sensitive UV cure tape in a vacuum chamber in close parallel position with said surface of the semiconductor wafer;
    inducing a subatmospheric vacuum condition in said vacuum chamber so as to cause said pressure-sensitive UV tape to engage said semiconductor wafer surface in close surface contact;
    treating said UV cure tape so as to reduce tacking thereof with said semiconductor wafer surface; and
    peeling said UV cure tape from said semiconductor wafer surface, wherein said adhesive deposits remain adherent to said tape and are removed from said semiconductor wafer surface in conjunction with the peeling off of said tape, said UV cure tape being repeatedly applied a plurality of times to said wafer surface for effectuating a complete removal, as required, of said adhesive residue deposits from said wafer surface.

2. A method, as claimed in claim 1, wherein said UV cure tape is treated with 10% IPA during application to the surface of said semiconductor wafer.

3. A method, as claimed in claim 1, wherein said UV cure tape is applied to the front surface of said semiconductor wafer so as to closely adhere to electronic components and C4 connections arranged on said front surface for removing said adhesive residue deposits remaining on said surface, components and C4 connections from preceding protective tapes, which were applied during processing of the backside of said semiconductor wafer.

4. A method, as claimed in claim 3, wherein said processing of the backside comprises grinding said back surface of the semiconductor wafer for the thinning of said wafer.

5. A method, as claimed in claim 1, wherein said tape comprises a UV cure tape which is applied to the front surface of said wafer.

6. A method as claimed in claim 1, wherein said front surface is subjected to a cleaning with $N_2$ gas after the peeling off of said UV cure tape from said surface.

7. A method for the removal of residual UV adhesive deposits from the surface of a semiconductor wafer, comprising the steps of:
    arranging a pressure-sensitive UV cure tape in close parallel position with said surface of the semiconductor wafer;
    interposing a liquid solvent solution between said pressure-sensitive UV tape and said semiconductor wafer prior to said pressure-sensitive UV tape engaging said semiconductor wafer surface in close surface contact;
    treating said UV cure tape so as to reduce tacking thereof with said semiconductor wafer surface; and
    peeling said UV cure tape from said semiconductor wafer surface, wherein said adhesive deposits remain adherent to said tape and are removed from said semiconductor wafer surface in conjunction with the peeling off of said tape, said UV cure tape being repeatedly applied a plurality of times to said wafer surface for effectuating a complete removal, as required, of said adhesive residue deposits from said wafer surface.

8. A method, as claimed in claim 7, wherein said liquid solvent comprises a 10% Isopropyl Alcohol (IPA) solution which is applied prior to or during application of said UV tape to the surface of said semiconductor wafer.

9. A method, as claimed in claim 7, wherein said UV cure tape is applied to the front surface of said semiconductor wafer, said solution inhibiting the formation of air pockets or bubbles on said wafer surface while enabling said UV tape to closely adhere to electronic components and C4 connections arranged on said front surface for removing said adhesive residue deposits remaining on said surface, components and C4 connections from preceding protective tapes, which were applied during processing of the backside of said semiconductor wafer.

10. A method, as claimed in claim 9, wherein said processing of the backside comprises grinding said back surface of the semiconductor wafer for the thinning of said wafer.

* * * * *